United States Patent
Ochiai et al.

(10) Patent No.: US 6,522,148 B2
(45) Date of Patent: Feb. 18, 2003

(54) STATE OF CHARGE MEASURING APPARATUS FOR BATTERY DEVICE

(75) Inventors: Shinobu Ochiai, Utsunomiya (JP); Yasumichi Ohnuki, Utsunomiya (JP); Atsushi Shibutani, Utsunomiya (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/133,395

(22) Filed: Apr. 29, 2002

(65) Prior Publication Data

US 2002/0171429 A1 Nov. 21, 2002

(30) Foreign Application Priority Data

May 1, 2001 (JP) .................................. 2001-134731

(51) Int. Cl.⁷ ............................................. G01N 27/416
(52) U.S. Cl. ........................................................ 324/428
(58) Field of Search ................................ 324/427, 428; 320/134, 136

(56) References Cited

U.S. PATENT DOCUMENTS 6,204,636 B1   3/2001   Kinoshita et al.

FOREIGN PATENT DOCUMENTS

JP   2001-69608   3/2001

Primary Examiner—Gregory J. Toatley, Jr.
(74) Attorney, Agent, or Firm—Arent Fox Kintner Plotkin & Kahn, PLLC (57) ABSTRACT

A state of charge (SOC) measuring apparatus for a battery device is provided capable of detecting accurate state of charge based on integrating charge and discharge current. The state of charge measuring apparatus carries out data substitution for displaying and controlling state of charge depending on the upper limit SOC or lower limit SOC. The integrated SOC obtained by integrating charge and discharge currents is corrected into the corrected SOC by the incremented corrected value incremented at every data substitution time. The state of charge measuring apparatus corrects the integrated SOC at every data substitution such that the difference between the integrated SOC and the corrected SOC becomes larger, and when the integrated SOC is smaller than the upper limit SOC and larger than the lower limit SOC, the corrected SOC is displayed on the display portion as the displaying and controlling SOC.

13 Claims, 8 Drawing Sheets

STATE OF CHARGE MEASURING APPARATUS FOR BATTERY DEVICE

BACKGROUND OF THE INVENTION

1. Field of the Invention

The present invention relates to an apparatus for measuring a state of charge of, for example, a battery device and particularly relates to a technique for correcting the state of charge of the battery obtained by calculation based on integrated electric current.

2. Description of the Related Art

When measuring a state of charge (SOC) of a battery, provided, for example, in a hybrid vehicle, the following method is known as a typical method, in which, since the state of charge is proportional to the total amount of charge stored in the battery, a total amount of charge and a total amount of discharge are first calculated by integrating a charge current and a discharge current detected for each predetermined period of time, and the state of charge of the battery can then be obtained by addition or subtraction of the integrated quantity of charge and the integrated quantity of discharge to or from an initial state of the battery or the initial state of charge of the battery immediately before starting charge and discharge.

However, the above method has a drawback in that, when obtaining the state of charge by measuring the integrated quantity of charge and the integrated quantity of discharge, the error contained in the calculated state of charge of the battery increases because errors in measurements of the charge current or the discharge current by the current detector in every current measurement is integrated.

In order to obtain an accurate value of the state of charge by the above total current integration method, Japanese Unexamined Patent Application, First Publication No. Hei 6-6901 proposes a battery state of charge measuring apparatus. The proposed detecting device first calculates an electrical consumption after correcting a standard consumption obtained by integrating the discharge current of the battery by multiplying each correction coefficient in response to battery terminal voltage, density, temperature, and discharge current, and the state of charge is calculated by obtaining a difference value obtained by subtracting the above electrical consumption from the initial charge of the battery and then by correcting the difference value by multiplying respective correction coefficients regarding a quantity of charge, a quantity of discharge before charging, the number of times of charging, a temperature at charging, and so on.

In the aforementioned state of charge measuring apparatus according to one example of the conventional techniques, various correction coefficients are employed obtained by previously stored predetermined relational equations or maps. Since these relational equations and maps are prepared according to characteristic properties at a predetermined state of the battery, for example, stable properties at a stationary state of the battery, a problem arises that the estimated state of charge of the battery obtained by the predetermined relational equations or maps may be separated from an actual value, when a storage capacity of the battery has been changed due to long term use or when the battery is replaced with a different type battery.

As described above, when the state of charge of the battery contains an error, there is a possibility to set a state of charge which differs from the controllable range of the battery, which may results in shortening of the service life of the battery or result in causing defective control of the motor or the engine.

BRIEF SUMMARY OF THE INVENTION

The present invention has been made to solve the above problems and an object of the present invention is to provide a battery state of charge measuring apparatus, capable of obtaining an accurate state of charge of a battery based on a value obtained by integrating charge and discharge currents, even when the battery properties have been changed after a long-term use or even when the battery has been replaced.

The first aspect of the present invention provides a state of charge measuring apparatus for a battery device comprising a battery (for example, a battery 14 in the embodiment shown below), a load (for example, a motor M in the embodiment shown below) driven by electrical power supplied from the battery device, and a state of charge calculating device (for example, integrated state of charge calculating portion 32 in the embodiment shown below) for detecting a charge and discharge currents (for example, charge and discharge currents I in the embodiment shown below) of the battery device and for calculating an integrated state of charge of the battery device (for example, integrated SOC in the embodiment shown below) based on an integrated value (for example, a consumed charge Q in the embodiment shown below) of charge and discharge currents, comprising a voltage detecting device (for example, a voltage detector 16 in the embodiment shown below) for detecting a terminal voltage (for example, a terminal voltage V in the embodiment shown below) of the battery, an upper limit substitution device (for example, an upper and lower limit substitution device 33 in the embodiment shown below) for substituting the integrated state of charge value to an upper limit state of charge (for example, an upper limit SOC in the embodiment shown below) when a detected voltage obtained by the terminal voltage detecting device exceeds a predetermined voltage (for example, an upper limit voltage VU in the embodiment shown below), and a decreasing side corrected state of charge calculating device (for example, corrected state of charge calculating portion 35 in the embodiment shown below) for calculating a corrected state of charge (for example, corrected SOC in the embodiment shown below) by correcting the integrated state of charge after the data substitution when the state of charge of the battery is decreasing, wherein the decreasing side corrected state of charge calculating device (for example, the corrected state of charge calculating portion 35 in the embodiment shown below) corrects such that a difference between the integrated state of charge and the corrected state of charge increases as the integrated value of the charge and discharge currents increases.

By constructing the state of charge measuring apparatus as shown above, the integrated state of charge data can be substituted to a predetermined upper limit in response to the terminal voltage, and a correction processing is carried out such that a difference between the integrated state of charge obtained after the data substitution and the corrected state of charge after correcting the integrated state of charge increases with the integrated value of the charge and discharge currents.

Even when a difference between the integrated state of charge and the actual state of charge increases as the integrated value of the charge and discharge currents increases, it is possible to improve the accuracy for approximating the corrected state of charge to the actual state of charge.

According to the second aspect, the state of charge measuring apparatus for a battery device comprising a battery device (for example, a battery 13 in the embodiment shown below), a load (for example, a motor M in the embodiment shown below) driven by electrical power supplied from the battery device and a state of charge calculating device (for example, an integrated state of charge calculating device 32 in the embodiment shown below) for detecting a charge current and discharge currents (for example, charge and discharge currents I in the embodiment shown below) of the battery device and for calculating an integrated state of charge of the battery based on an integrated value (for example, a consumed charge Q in the embodiment shown below) of the charge and discharge currents, comprising, a voltage detecting device (for example, a voltage detector 16 in the embodiment shown below) for detecting a terminal voltage (for example, a terminal voltage V in the embodiment shown below) of the battery device, an lower limit substitution device (for example, a upper and lower limit values substitution portion 33 in the embodiment shown below) for substituting the integrated state of charge value to an lower limit state of charge when a detected voltage obtained by the terminal voltage detecting device falls below a predetermined voltage (for example, a lower limit SOC in the embodiment shown below), and an increasing side corrected state of charge calculating device (for example, a corrected state of charge calculating portion 35 in the embodiment shown below) for calculating a corrected state of charge by correcting the integrated state of charge after the data substitution when the state of charge of the battery is increasing, wherein the increasing side corrected state of charge calculating device corrects such that a difference between the integrated state of charge and the corrected state of charge increases as the integrated value of the charge and discharge currents increases.

By constructing the state of charge measuring apparatus as shown above, the integrated state of charge data can be substituted to a predetermined lower limit in response to the terminal voltage, and a correction processing is carried out such that a difference between the integrated state of charge obtained after the data substitution and the corrected state of charge after correcting the integrated state of charge increases as the integrated value of the charge and discharge currents.

Even when a difference between the integrated state of charge and the actual state of charge increases as the integrated value of the charge and discharge currents increases, it is possible to improve the accuracy for approximating the corrected state of charge to the actual state of charge.

According to the third aspect, in the above state of charge measuring apparatus for a battery device, the battery state of charge measuring apparatus further comprises an upper limit substitution value calculating device (for example, an upper and lower limit substitution value calculating portion 34 corrected state of charge calculating portion 35 in the embodiment shown below) for calculating a substitution value (for example, (upper limit SOC−lower limit SOC) in the embodiment shown below) from the integrated state of charge to the upper limit value by a difference between the integrated state of charge and the upper limit value, and the decreasing side corrected state of charge calculating device comprises a correction value incrementing device (for example, a correction value adding portion 36 in the embodiment shown below), provided to be used when the correction value exceeds a predetermined correction value while defining a first unit correction value (for example, a unit correction value B0 in the embodiment shown below) used as a correction value for one time data substitution, for incrementing the correction value (for example, a correction value A in the embodiment shown below) by adding a first unit correction value each time the data substitution is repeated.

By constructing the state of charge measuring apparatus as shown above, the correction value is incremented as the number of correcting time increases, and the difference between the corrected state of charge calculated by the above correction value and the integrated state of charge calculated after the data substitution increases.

Accordingly, as the number of times of data substitution increases, the corrected state of charge can be approximated in a more accurate manner.

According to the fourth aspect, the above state of charge measuring apparatus for a battery device comprises a lower limit substitution value calculating device (for example, the upper and lower limit substitution amount calculating device 34 shown below in the embodiment) for calculating a substitution value (for example, (data substitution time integrated SOC−lower limit SOC) in the embodiment shown below) for substituting from the integrated state of charge to the lower limit based on a difference between the integrated state of charge and the lower limit value, wherein the increasing side correction state of charge incrementing device defines a first predetermined unit correction value (for example, unit correction value B0 in the embodiment shown below) as a value (for example, a correction value A in the embodiment shown below) for correcting at one correction time, when the substitution value is greater than a predetermined value (for example, (unit correction value B0+previous correction value) in the embodiment shown below) and increases the correction value by adding said first unit correction value each time when the data substitution is performed.

By constructing the state of charge measuring apparatus as shown above, the correction value is incremented as the number of correcting time increases, and the difference between the corrected state of charge calculated by the above correction value and the integrated state of charge calculated after the data substitution increases.

Accordingly, as the number of times of data substitution increases, the corrected state of charge can be approximated in more accurate manner.

According to the fifth aspect, the correction value incrementing device adjusts the correction value to the same value as that of the substitution value when a difference between the substitution value and the added corrected value is less than the first unit correction value.

By constructing the state of charge measuring apparatus as shown above, the corrected state of charge is calculated based on the substitution value, which is obtained from the difference between the integrated state of charge and the lower limit value of the state of charge or the difference between the integrated state of charge and the upper limit state of charge.

According to the sixth aspect, in the above state of charge measuring apparatus for a battery device, when a difference between the substitution value and the added corrected value is less than the first unit correction value, the correction value incrementing device corrects the state charge of the battery device using a correction value that is a sum of the second unit correction value, which is less than the first unit correction value, and the corrected value obtained until the previous time.

According to the above state of charge measuring apparatus of the battery device, the correction state of charge is obtained as a sum of the second unit correction value and the correction value obtained until the previous correction time.

The correction state of charge obtained by this aspect is more closer to the required correction value than when the correction state of charge is obtained by use of the first unit correction value.

According to the next aspect of the present invention, the state of charge measuring apparatus for a battery device comprises a display device for displaying said corrected state of charge.

DETAILED DESCRIPTION OF THE INVENTION

Figure 1:
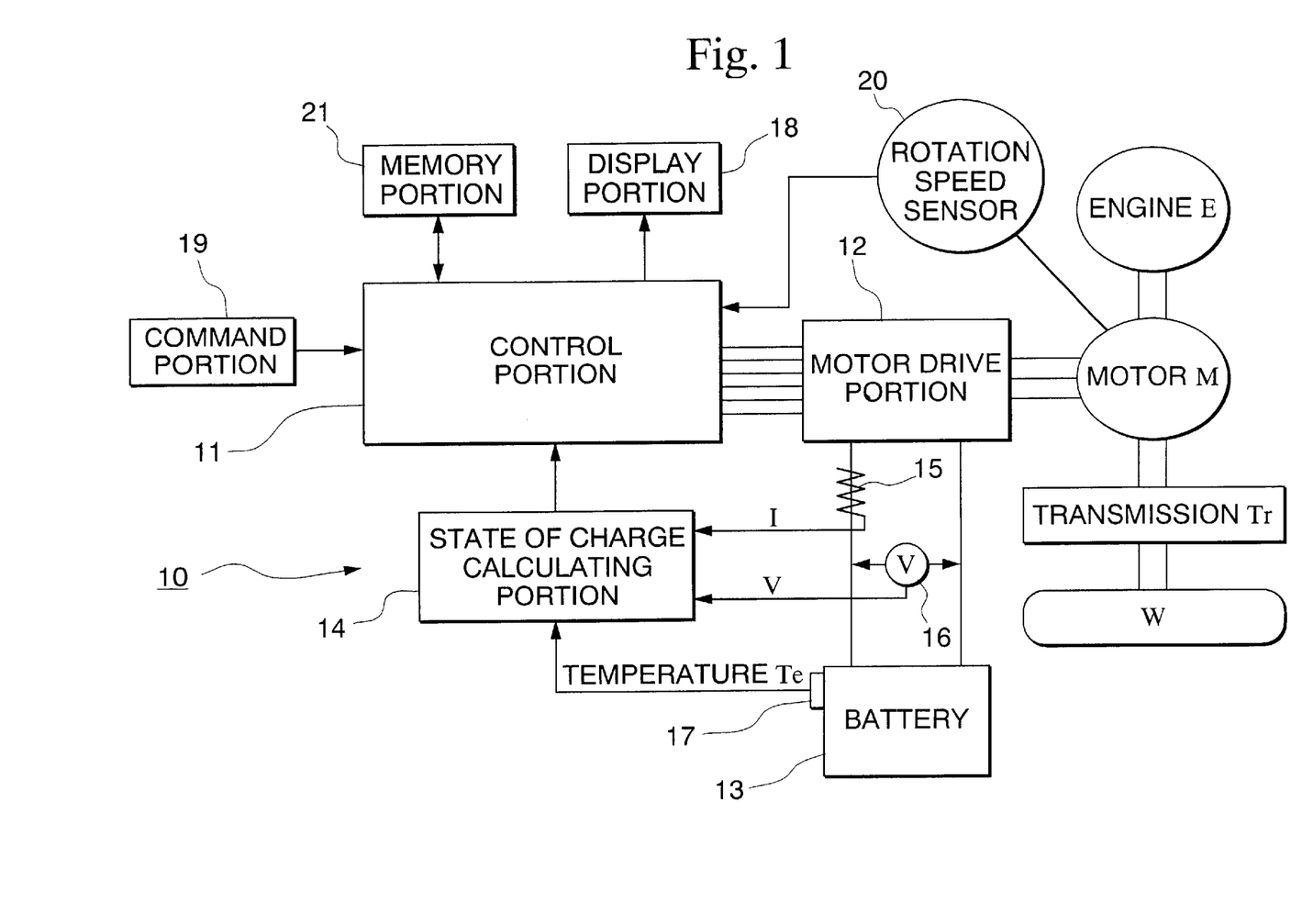
FIG. 1 is a diagram showing a structure of a state of charge (SOC) detecting device for a battery device according to one embodiment of the present invention.
Figure 2:
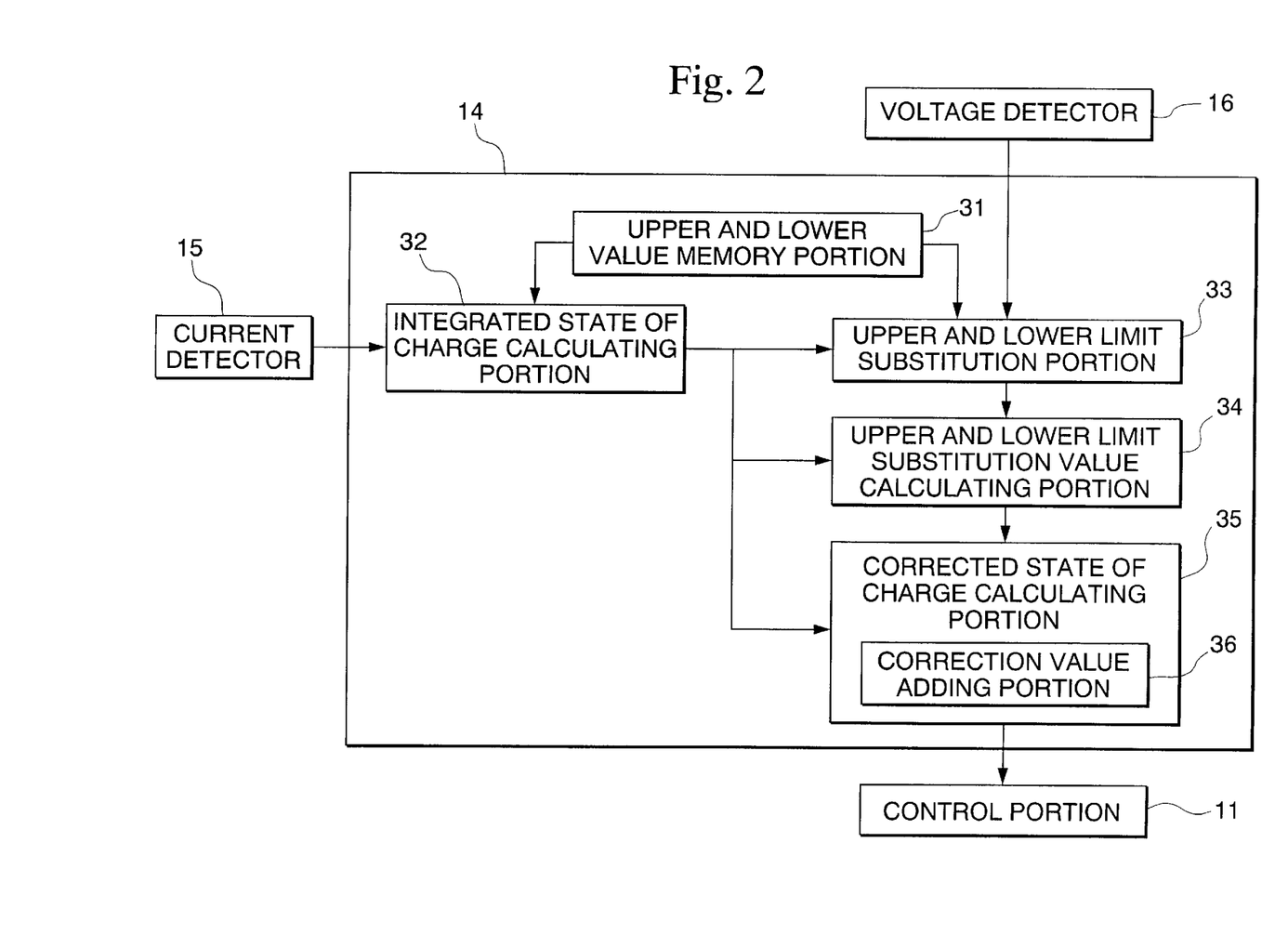
FIG. 2 is a block structural diagram showing a SOC calculating portion shown in FIG. 1.

Hereinafter, an embodiment of a state of charge measuring apparatus for a battery device according to the present invention is described with reference to the attached drawings. FIG. 1 is a diagram showing a structure of a state of charge (SOC) measuring apparatus 10 for a battery device according to one embodiment of the present invention. FIG. 2 is a block structural diagram showing an SOC calculating portion 14 shown in FIG. 1.

The state of charge (SOC) measuring apparatus 10 for a battery device (hereinafter, simply called an SOC measuring apparatus) is installed on, for example, electric vehicles or hybrid vehicles. The hybrid vehicle 1 shown in FIG. 1 is a parallel type hybrid vehicle, in which an engine E, a motor M, and a transmission mechanism T are directly connected in series.

In this type of hybrid vehicle 1, the driving force of the engine E and the motor are transmitted to driving wheels through a transmission mechanism T.

When the driving force is transmitted from the driving wheels while the hybrid vehicle 1 is decelerating, the motor M functions as a generator for generating what is called a regenerative braking force and kinetic energy of the vehicle is recovered as electric energy.

Furthermore, according to the driving conditions of the vehicle, the motor M is driven by the output of the engine E as a generator, which generates electrical energy.

A motor driving portion 12 controls the motor M by the control command from the control portion 11 whether it is driven or it carries out regeneration.

The motor driving portion 12 is provided with a battery 13, which stores generation energy or regeneration energy generated by the motor M and the battery supplies electrical energy to the motor M.

The state of charge measuring apparatus 10 according to one embodiment of the present invention is constituted by, for example, a battery 13, composed of Ni—MH (nickel-metal hydride) employing metal hydride as a cathode active material, a state of charge calculating portion 14 for calculating the state of charge of the battery 13, a voltage detecting portion 16 for detecting a terminal voltage V of the battery 13, a temperature detector 17 for detecting the temperature T of the battery 13, and a display portion 18 for displaying the state of charge calculated by the state of charge calculating portion 14.

Here, the state of charge calculating portion 14 outputs the state of charge obtained by calculation described below to a control portion 11, wherein the state of charge is displayed to crews of the hybrid vehicle and is used for controlling the motor M (the displaying and controlling state of charge).

The control portion 11 outputs the displaying and controlling state of charge received from the state of charge calculating portion 14 to the display portion 18 for display in, for example, a display panel (not shown).

The control portion 11 further outputs to a motor driving portion 12 a current command for directing an electric current to be supplied to the motor M for generating a required torque based on a signal of an accelerator control input regarding a depressing operation of an accelerator pedal by the driver, a signal of a rotation speed of the motor output from a rotation speed sensor 20 for detecting the rotation speed of the motor, and the state of charge for display and control received from the state of charge calculating portion 14.

Note that the control portion 11 comprises a memory portion 21, which stores data related to predetermined reference parameters, which are referred to when controlling the motor M.

The state of charge calculating portion 14 comprises an upper limit and lower limit value memory portion 31, an integrated state of charge calculating portion 32, an upper limit and lower limit substitution portion 33, an upper limit and lower limit substitution value calculation portion 34, and a corrected state of charge calculating portion 35.

The state of charge calculation portion 14 receives signals regarding the charge and discharge currents I output from the current detector, which detects the charge current supplied from the battery 13 to loads such as the motor M and the discharge current supplied from the motor M by regeneration or power generation thereof, and receives a signal on a terminal voltage of the battery 3 output from the voltage detector 16 which detects the terminal voltage V of the battery 3.

Furthermore, the state of charge calculating portion 14 outputs the state of charge obtained by calculation processing to the display portion 17 provided, for example, in the display panel (not shown) for displaying to the crew of the vehicle as the displaying and controlling SOC used for displaying to the crew of the vehicle or for controlling the motor M and the like.

The upper and lower limit memory portion 31 stores an upper limit SOC (for example, 80%) and a lower limit SOC (for example, 20%).

The integrated state of charge calculating portion 32 obtains the consumed charge Q by multiplying the integrated charge and discharge currents I of the battery 3 by a predetermined charge conversion coefficient Kc. When the upper limit value QU (for example, the upper limit SOC) is adopted as the standard, the integrated SOC is obtained by subtracting the consumed charge Q from the predetermined upper limit QU (for example, upper limit SOC). When the lower limit QL (for example, the lower limit SOC) is adopted as the standard, the integrated SOC obtained by adding the consumed charge Q to the lower limit QL. These integrated SOCs are output to the upper and lower limit substitution portion 33, the upper and lower limit substitution value calculation portion 34, and corrected state of charge calculating portion.

The integrated SOC is compared with the lower limit SOC and the upper limit SOC, stored in the upper and lower limit storing portion. When the integrated SOC is lower than the lower limit SOC or when the integrated SOC is higher then the upper limit SOC, the integrated SOC is set as the SOC value for display and control.

$$\left. \begin{array}{l} \text{The consumed charge } Q = Kc \int I dt \\ \text{When calculating using the upper limit as the} \\ \text{standard value: integrated} \\ SOC = \text{upper limit } QU - \text{consumed charge } Q \\ \text{When calculating using the lower limit as the} \\ \text{standard value: integrated} \\ SOC = \text{lower limit } QU - \text{consumed charge } Q \end{array} \right\} \quad (1)$$

Note that when the integrated state of charge calculating portion 32 calculates the consumed charge Q by accumulating the charge and discharge current I, the integrated amount of charge and discharge current I is estimated using the predetermined upper limit QU and the lower limit QL as the initial value.

When the integrated state of charge calculating portion 32 calculates the integrated SOC, a final integrated SOC is obtained after carrying out a predetermined correction procedure by correcting a temperature dependent change of the internal resistance in response to a signal indicating the temperature T of the battery 3 detected by the temperature detector 17.

The upper limit and the lower limit substitution portion 33 obtains the upper limit SOC and the lower limit SOC, which are stored in the upper and lower limit memory portion 31 and data with respect to the integrated SOC and the corrected SOC for display and for control are substituted by the upper limit SOC and the lower limit SOC responding to the terminal voltage V output from the voltage detector 16.

For example, when the terminal voltage V exceeds a predetermined upper limit voltage VU, the SOC for display and for control is set at the upper limit voltage VU. In contrast, when the terminal voltage V is below a predetermined lower limit voltage VL, the displaying and controlling SOC is set at the lower limit voltage.

Such data substitution is performed utilizing the state of charge characteristics of a battery 13 such as the Ni—MH cell, in which the terminal voltage V of the battery 13 changes only when the state of charge is near the upper limit (upper limit SOC) or the lower limit (lower limit SOC), and by switching the integrated state of charge (integrated SOC) into the actual state of charge by detecting the change of the terminal voltage, the accurate state of charge can be substituted near the upper and lower limit state of charge. Note that when the state of charge is within a range between the upper limit and the lower limit wherein the terminal voltage changes slightly, the state of charge can be obtained by calculating the charge and discharge current I.

When the displaying and controlling SOC is substituted by the upper limit SOC or the lower limit SOC at the upper lower limit substitution portion 33, the upper and lower limit substitution value calculating portion 34 calculates a difference between the integrated SOC at the time of data substitution (hereinafter, called a data substitution time integrated SOC) and the upper limit SOC (that is, the upper limit SOC-data substitution time accumulation SOC), and a difference between the integrated SOC at the time of data substitution and the lower limit SOC (that is, the data substitution time integrated SOC-the lower limit SOC).

The corrected state of charge calculating portion 35 obtains the integrated SOC calculated by the integrated state of charge calculating portion 32 and calculates the corrected SOC by correcting the integrated SOC based on the initial charge AI (for example, 60%) and the correction value A. When the integrated SOC is above the upper limit SOC and below the lower limit SOC, the corrected SOC is set as the displaying and controlling SOC.

When the displaying and controlling SOC is substituted by the lower limit SOC in, for example, the upper and lower limit substitution portion 33, the corrected SOC is calculated, as shown by the equation (2) shown below, by the lower limit SOC, the integrated SOC, the initial charge AI, and the correction value A.

In contrast, when the displaying and controlling SOC is substituted by the upper limit SOC in, for example, the upper and lower limit substituting portion 33, the corrected SOC is calculated, as shown by the equation (3) shown below, by the upper limit SOC, the integrated SOC, the initial charge AI, and the correction value A.

Regarding the corrected SOCs obtained by calculating the following equations (2) and (3), the differences between the integrated SOC and the above corrected SOCs by the following equations (2) and (3) increases as the integrated SOC (that is, integrated charge and discharge currents) increases, and the rate of increase of the difference is determined by the correction rate of increase shown by {initial charge AI/(initial charge AI–correction value A)}. That is, the rate of increase becomes larger when the correction value A becomes larger and Vise Versa.

$$\left. \begin{array}{l} \text{Displaying and controlling } SOC = \text{corrected } SOC = \\ \text{lower limit } SOC + (\text{integrated } SOC - \text{lower limit } SOC) \times \\ (\text{initial charge } AI / (\text{initial charge } AI - \text{correction value } A) \end{array} \right\} \quad (2)$$

$$\left. \begin{array}{l} \text{Displaying and controlling } SOC = \text{corrected } SOC = \\ \text{upper limit } SOC + (\text{integrated } SOC - \text{upper limit } SOC) \times \\ (\text{initial charge } AI / (\text{initial charge } AI - \text{correction value } A) \end{array} \right\} \quad (3)$$

Furthermore, the corrected state of charge calculating portion 35 comprises a correction value adding portion 36, and the correction value adding portion 36 sets the correction value A by adding a previous correction value AP to a predetermined unit correction value BO (for example, 10%).

However, when the difference between the data substitution value obtained by the upper and lower limit substitution value calculating portion 34 and the previous correction value AP is less than the unit correction value B0, this data substitution value is set to the correction value A.

That is, after the displaying and controlling SOC is substituted by the upper limit SOC at the upper and lower limit substitution portion 33, the substituted data obtained by subtracting the integrated SOC from the data substitution time upper limit SOC is set as the correction value A.

In contrast, when the displaying and controlling SOC is substituted by the lower limit SOC at the upper and lower limit substitution portion 33, data obtained by subtracting the lower limit SOC from the data substitution time integrated SOC is set as the correction value A.

Correction value A=unit correction value+previous correction value AP   (4)

Correction value A=upper limit SOC−integrated SOC at data substitution   (5)

Correction value A=data integrated SOC at data substitution−lower limit SOC   (6)

Figure 3:
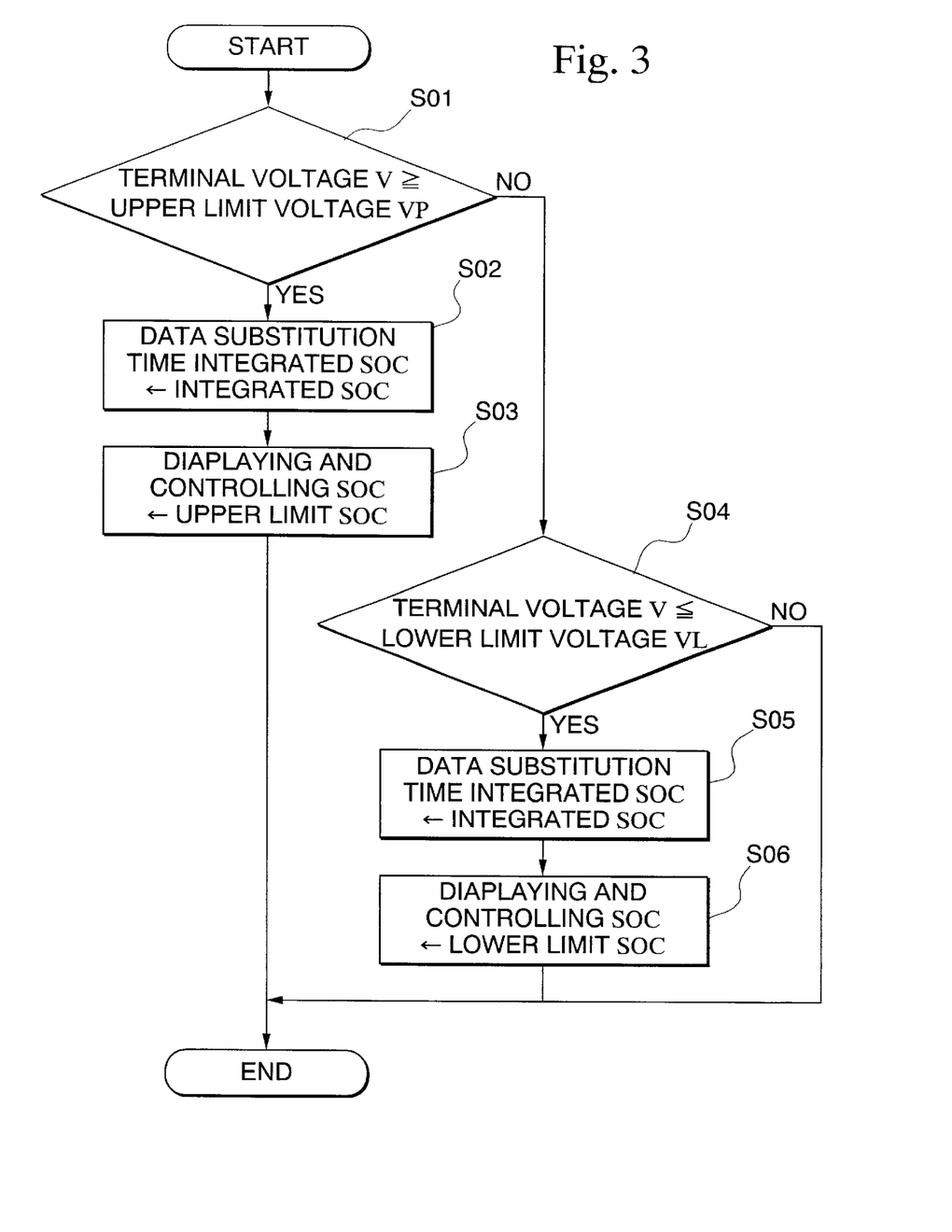
FIG. 3 is a flowchart showing operations of a SOC measuring apparatus shown in FIG. 1, particularly showing processing for setting a SOC value for display and control according to a terminal voltage of a battery detected by the charge detecting device.
Figure 4:
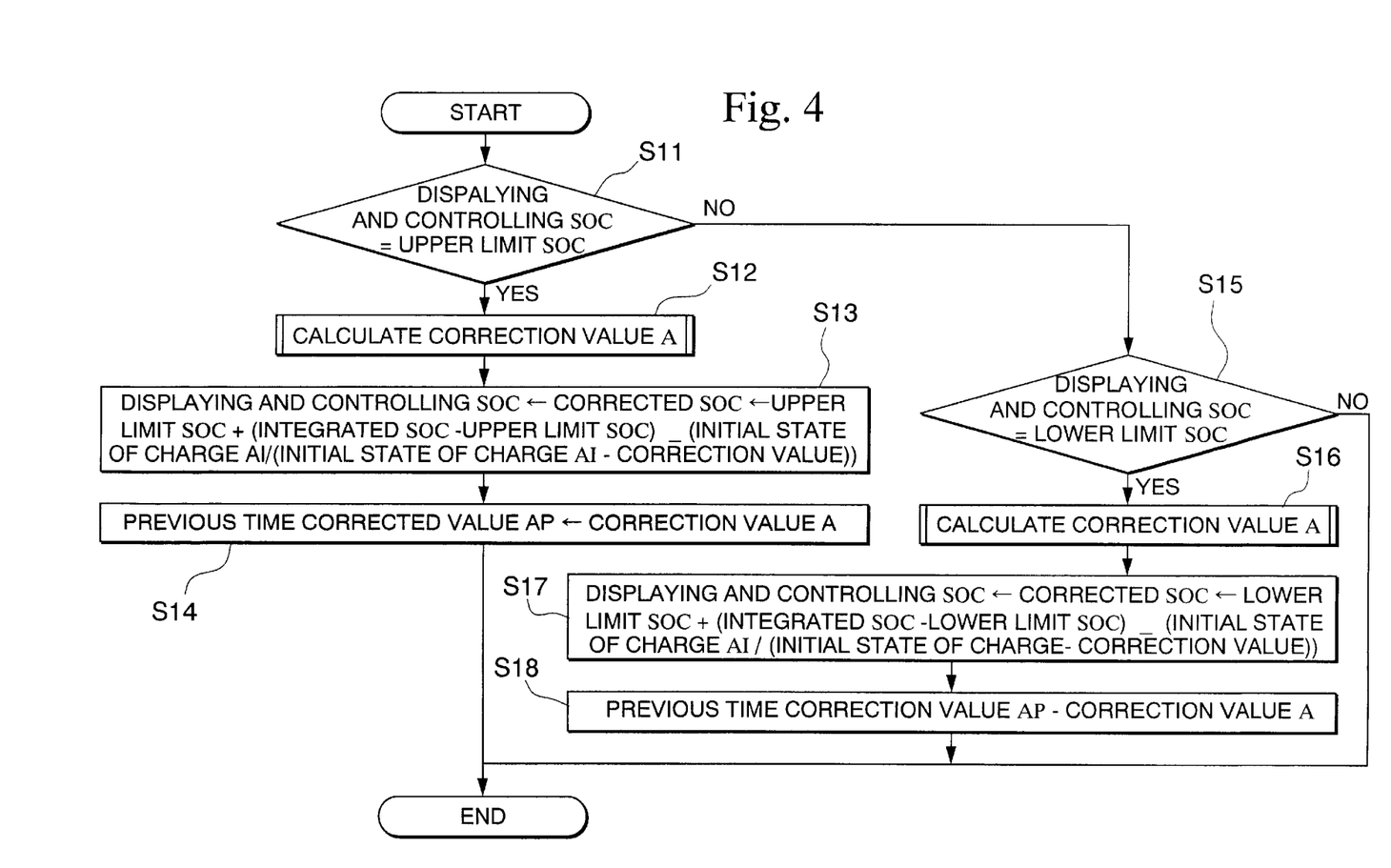
FIG. 4 is a flowchart showing operations of the SOC measuring apparatus shown in FIG. 1, particularly showing processing for calculating a corrected SOC value for display and for control.
Figure 5:
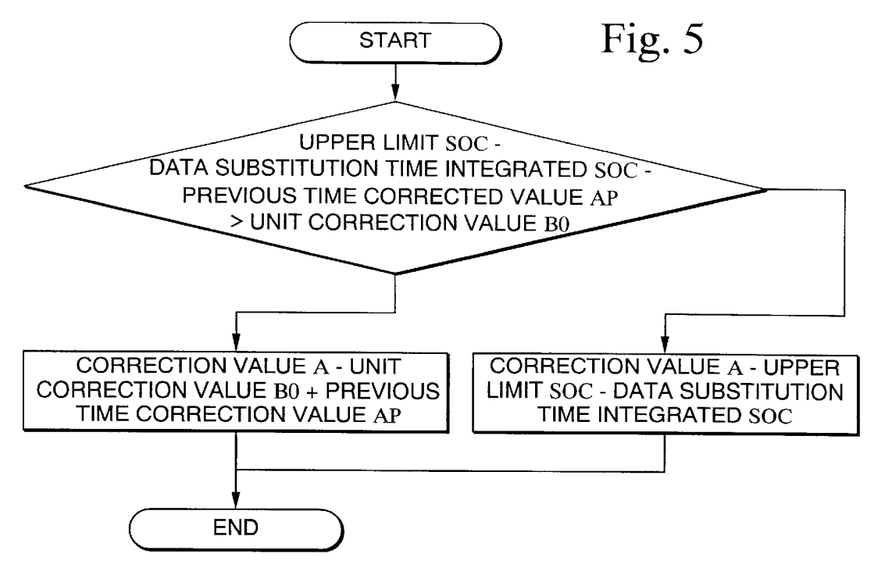
FIG. 5 is a flowchart showing processing for calculating a correction value A.
Figure 6:
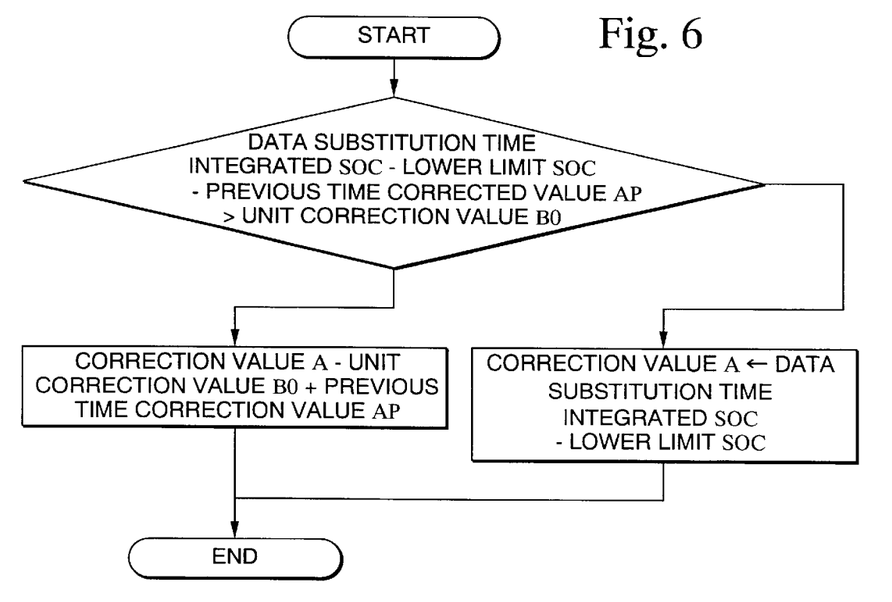
FIG. 6 is a flowchart showing processing for calculating a correction value A.
Figure 7:
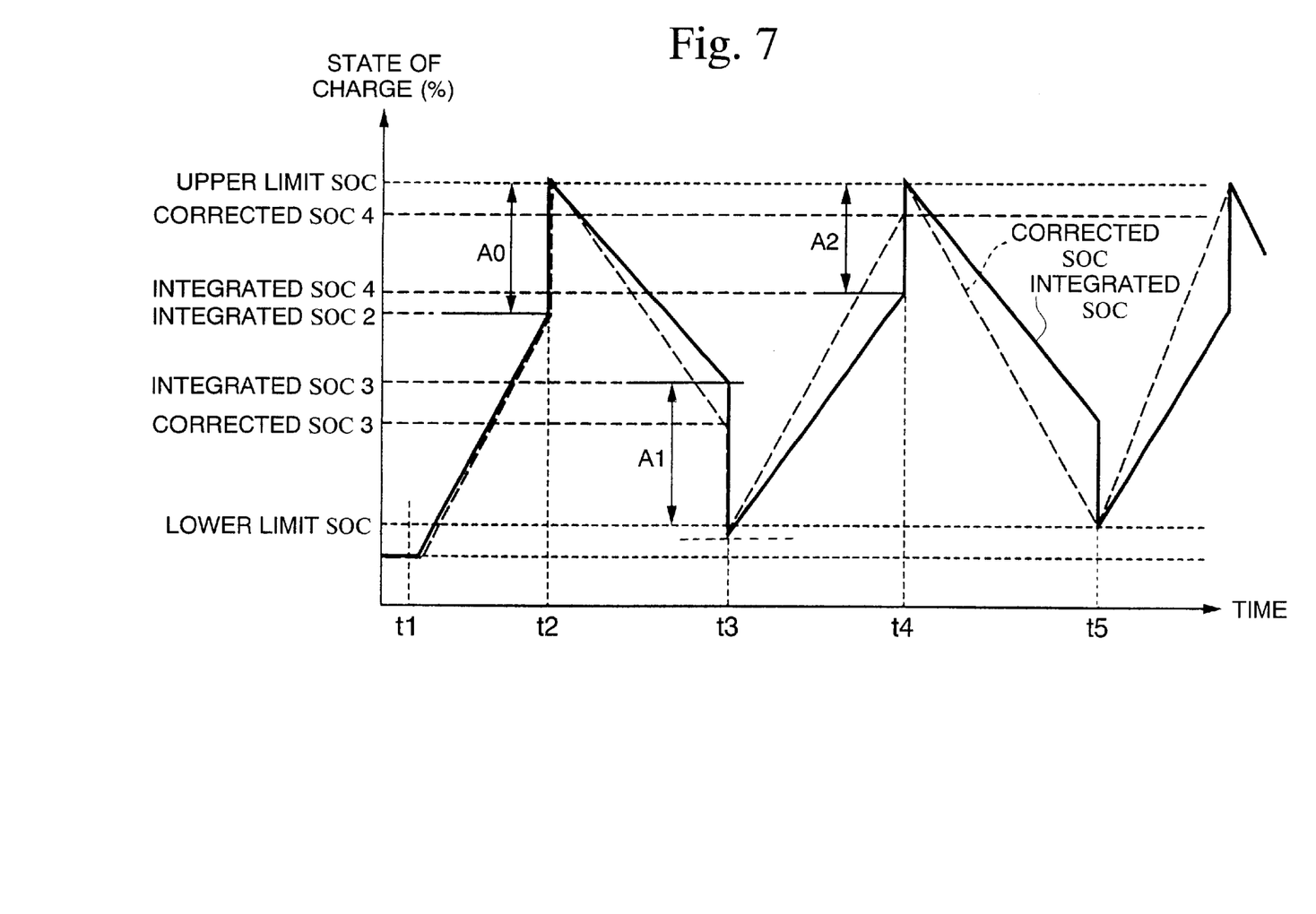
FIG. 7 is a graph showing an example of time dependent changes of the integrated SOC and the corrected SOC obtained by the SOC calculating portion.
Figure 8:
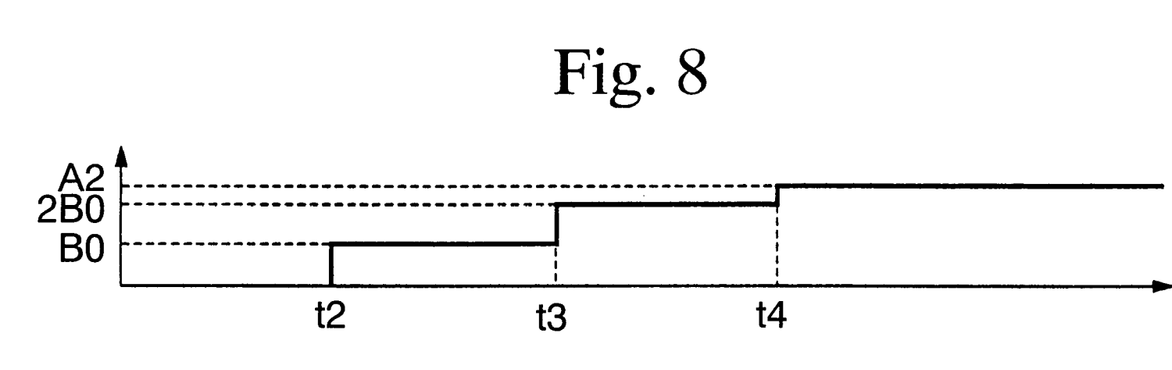
FIG. 8 is a graph showing an example of time dependent changes of the correction value A obtained by the SOC calculating portion.
Figure 9:
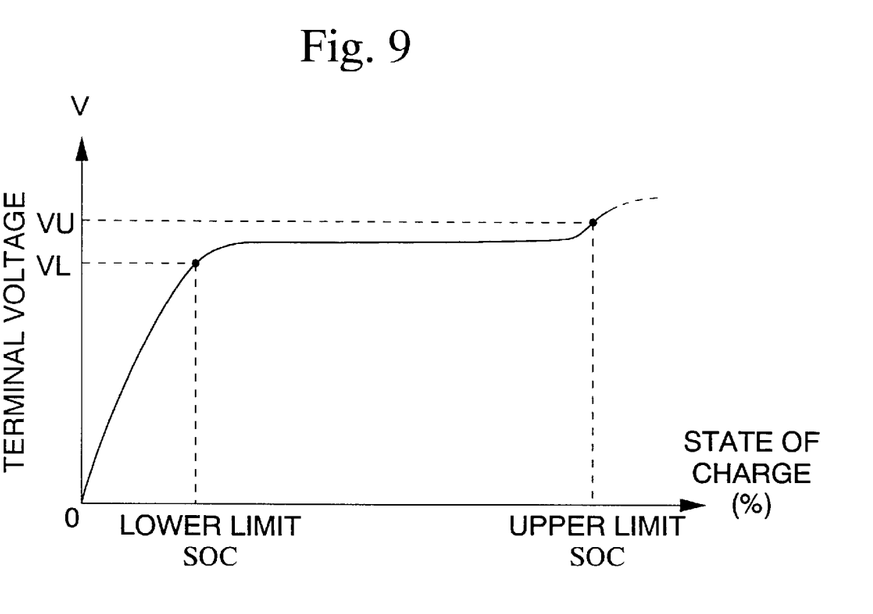
FIG. 9 is a diagram showing a relationship between an SOC of a battery and a terminal voltage.

The battery state of charge measuring apparatus 10 according to the present embodiment is constructed as shown above. The operation of the battery state of charge measuring apparatus 10 will be described below with reference to the attached drawings. FIG. 3 shows an operation of the state of charge measuring apparatus 10, and particularly shows a flowchart showing a process for setting the displaying and controlling SOC in response to a terminal voltage V detected by the voltage detector 16. FIG. 4 is a flowchart showing an operation of the state of charge measuring apparatus 10, particularly showing a process for detecting a corrected value of SOC as a controlling SOC. FIG. 5 and FIG. 6 are flowcharts showing the process for calculating the correction value A as the displaying and controlling SOC. FIG. 7 is a graph showing examples of time dependent changes of the integrated SOC obtained at the state of charge calculating portion 14 and the corrected SOC, and FIG. 8 is an example of a time dependent change of the correction value A obtained by the state of charge calculating portion 14.

In step S01 shown in FIG. 3, it is determined whether the terminal volatge V of the battery detected by the voltage detector 16 is higher than the upper limit voltage VU.

When the determination is "NO", the flow proceeds to step S04, which is described below.

In contrast, when the determination is "YES", the flow proceeds to step S02 when the time reaches the time t2 or the time t4, shown in FIG. 7.

In step S02, the integrated SOC shown in the above equation (1) (for example, the integrated SOC 2 or the integrated SOC 4 shown in FIG. 7) are set to the data substitution time integrated SOC.

In step S03, the upper limit SOC (for example, 80%) is set to the displaying and controlling SOC and the flow is completed.

The integrated SOC set as the displaying and controlling SOC 2, which is obtained as a value, for example, at time t2 as shown in FIG. 7, is thereby substituted with the upper limit SOC and the displaying and controlling SOC is calibrated.

In step S04, in contrast, it is determined whether the terminal voltage V of the battery 13 detected by the voltage detector 16 is less than the lower limit voltage VL.

When the determination is "NO", the flow is completed without performing the data substitution to the upper limit SOC or the lower limit SOC.

In contrast, when the above determination is "YES", that is, when arriving at the time t3 shown in FIG. 7, the flow proceeds to step S05.

In step S05, the integrated SOC (that is, the integrated SOC 3 shown in FIG. 7) is set to the integrated SOC at the data substitution.

Subsequently, in step S06, the lower limit SOC (for example, 20%) is set to the displaying and controlling SOC and the flow is completed.

The SOC 3, which is set as the displaying and controlling SOC such as the time t3 shown in FIG. 7, and which is described later, is thereby substituted by the lower limit SOC and the displaying and controlling SOC is calibrated.

Below, a process for calculating a corrected SOC as the displaying and controlling SOC is described, which is carried out in parallel to the aforementioned process from step S01 to step S06.

First, in step S11 shown in FIG. 4, it is determined whether the predetermined upper limit SOC is set as the displaying and controlling SOC.

When the determination in step S11 is "NO", the flow proceeds to step S15, which will be explained later. If the determination in step S11 is "YES", the flow proceeds to step S12.

In step S12, the correction A is calculated as described below.

In step S13, the corrected SOC is calculated based on the correction value A, a predetermined initial charge AI (for example, 60%), and the upper limit SOC. The corrected SOC obtained as described above is set as the displaying and controlling SOC and the corrected SOC is output to the control portion 11.

Next, in step S14, the correction value A calculated in step S12 is set to the previous correction value AP which is the correction value A calculated in the previous process, and the flow is completed.

In contrast, in step S15, it is determined whether the predetermined lower limit SOC is set as the displaying and controlling SOC.

When the determination is "NO", the flow is completed. In contrast, if the determination is "YES", the flow proceeds to step S16.

In step S16, a correction value A is calculated as described below.

When the determination is "NO", the flow is completed. If the determination is "YES", the flow proceeds to step S16.

In step S16, the correction value A, the correction value A is calculated, as shown below.

In step S17, the corrected SOC is calculated based on the correction value A calculated in step S16, the predetermined initial charge AI (for example, 60%), and the lower limit SOC. This correction SOC is set to the displaying and controlling SOC, which is output to the control portion 11.

Next, in step S18, the correction value A obtained in step S16 is set to the previous correction value AP, obtained in previous processing, and the flow is completed.

Below, a calculation processing in aforementioned step S12 is described.

First, in step S21 shown in FIG. 5, it is determined whether the difference between the data substituted value (for example, A or A2 shown in FIG. 7), that is, the value obtained by subtracting the integrated SOC at the time of data substitution and the previous correction value AP is greater than the unit correction value B0.

When the determination is "YES", the flow proceeds to step S22. If the determination is, in contrast, "NO", the flow proceeds to step S23.

In step S22, a value obtained by addition of the unit correction value B0 and the previous correction value AP is set to the correction value A, and the flow is completed.

In step S23, a value obtained by subtracting the data substitution time integrated SOC from the upper SOC is set to the correction value A, and the flow is completed.

That is, the correction value A obtained by calculating the aforementioned equation (4) is compared with the data substitution value, that is, the upper limit SOC–the integrated SOC at the time of data substitution, and a smaller one among these two values are set to the correction value A.

Below, the calculation of the correction value A, performed in the aforementioned step S16, is explained.

In step S31 shown in FIG. 6, it is determined whether a difference between the data substitution value (for example, A1 in FIG. 7), that is, a value obtained by subtracting the lower limit SOC from the data substitution time integrated SOC (the data substitution time integrated SOC–the lower limit SOC) and the previous correction value AP is larger than the predetermined unit correction value B0.

When the determination is "YES", the flow proceeds to step S32. In contrast, when the determination is "NO", the flow proceeds to step S33.

In step S32, a value obtained by addition of the unit correction value B0 and the previous correction value AP is set to the correction value A and the flow is completed.

In step S33, the value obtained by subtracting the lower limit SOC from the data substitution time integrated SOC, that is, the data substitution value is set to the correction value A and the flow is completed.

That is, a comparison is made between the correction value A obtained by calculating the equation (4) and the data substitution value (that is, the data substitution time integrated SOC–lower limit SOC) and the smaller value among these two values are set to the correction value A.

For example, when the battery, reset at time t1 shown in FIG. 7, arrives at time t2 while the battery is gradually charged, the terminal voltage V exceeds the predetermined upper limit voltage VU.

At this time, the integrated SOC, obtained by calculating, for example, the equation (1), is equal to the integrated SOC 2. Although this integrated SOC 2 is set as the displaying and discharging SOC, the integrated SOC 2 is now substituted by the upper limit, so that the displaying and controlling SOC changes as if the displaying and controlling SOC increases by the data substitution value A0.

When the time reaches t3 from the time t2 while gradually discharging after the data substitution, the integrated SOC (shown by the solid line in FIG. 7) is calculated using the equation (1) at the integrated state of charge calculating portion 32 and at the same time, as shown in FIG. 8, the unit correction value B0 is set as the correction value A following to the equation (4).

The corrected SOC (shown by a dotted line in FIG. 7) is calculated based on this correction value A using the equation (3) and the corrected SOC is set to the displaying and controlling SOC.

Note that the integrated SOC2 shown in FIG. 7 is used as the data substitution time integrated SOC at this time.

When the time arrives at time t3, the terminal voltage V falls below the lower limit voltage VL.

At this time, the integrated SOC obtained by calculating, for example, the aforementioned equation (1) is set as the integrated SOC 3, shown in FIG. 7. The corrected SOC obtained by the equation (3) is equal to the corrected SOC 3.

Here, the corrected SOC 3 set as the displaying and controlling SOC is substituted by the lower limit SOC, so that the displaying and controlling SOC changes as if the SOC value is subtracted by the data substitution value A1.

In the time period between the time t3 and t4, wherein the battery is gradually discharged after the data substitution, the integrated SOC is calculated at the integrated state of charge calculating portion 32 using the equation (1), and as shown in FIG. 8, the data substitution value A2 ( that is, the upper limit SOC–the integrated SOC4) is set as the correction value A using the equation (4).

The corrected SOC is calculated using the equation (2) based on the aforementioned correction value A and this corrected SOC is set as the displaying and controlling SOC.

Note that the data substitution time integrated SOC at this time is the integrated SOC3 shown in FIG. 7.

When the time arrives at t4, the terminal voltage V of the battery exceeds the predetermined upper limit VU.

At this time, the integrated SOC calculated by the aforementioned equation (1) is equal to the integrated SOC 4 shown in FIG. 7, and the corrected SOC calculated by the equation (2) is equal to the corrected SOC4 as shown in FIG. 7.

Here, the corrected SOC4, set as the displaying and controlling SOC, is substituted by the upper limit SOC so that the corrected SOC changes as if a correction value A2 is added.

In the time period between the time t4 and t5, wherein the battery 3 is gradually discharged after the data substitution, the integrated SOC is calculated using the equation (1) at the integrated state of charge calculating portion 32, and at the same time, as shown in FIG. 8, the data correction value A2 (that is, the upper limit SOC–the integrated SOC4) is set as the correction value A using the equation (5).

In this case, the relationship holds that the previous correction value AP=2×unit correction value B0, the data substitution value A2 is below the correction value A (=3× unit correction value B0) as obtained by calculation of the equation (4), just like the case when the determination in step S21 is "NO".

Based on the correction value A, the corrected SOC is calculated by the aforementioned equation (3), and the corrected SOC is set as the displaying and controlling SOC.

Note that the data substitution time integrated SOC at the above case is equal to the integrated SOC4.

As shown above, according to the state of charge measuring apparatus 10 of the present embodiment, the correction SOC can be gradually approximated to the actual state of charge of the battery 13 by increasing the correction value A such that the difference between the integrated SOC and the corrected SOC expands, whenever the displaying and controlling SOC is substituted by the upper limit or the lower limit according to the terminal voltage of the battery 13.

The above measure thereby makes it possible to detect the displaying and controlling SOC accurately in comparison with the actual state of charge, even when the battery deteriorates over time after long term use or even when another type of battery having a different charge capacity is used by replacing the original battery.

Note that, in the above embodiment, it is decided to set in steps S23 and S33 data substitution values comprising (the upper limit SOC–the data substitution time integrated SOC) or (the data substituting time integrated value–the lower limit) as the correction value A. However, it is also possible to set a correction value A by adding a predetermined unit correction value B1 (for example, 5%), which is smaller than the predetermined unit correction value B0, as shown in the following equation (7).

Correction value $A$=a first unit correction value $B1$+the previous correction value $AP$ (7)

In addition, in the above embodiment, although the correction value is incremented gradually by adding a unit correction value B0, the data substitution values obtained by the equations (5) and (6) can be used as the correction values, not increasing the correction values gradually.

What is claimed is:

1. A state of charge measuring apparatus for a battery device comprising
   a battery;
   a load driven by electrical power supplied from the battery device, and a state of charge calculating device for detecting a charge current and discharge current of said battery device and for calculating an integrated state of charge of the battery device based on an integrated value of charge current and discharge current, comprising:
   a voltage detecting device for detecting a terminal voltage of said battery device;
   an upper limit substitution device for substituting said integrated state of charge value to an upper limit state of charge when a detected voltage obtained by said terminal voltage detecting device exceeds a predetermined voltage; and
   a decreasing side corrected state of charge calculating device for calculating a corrected state of charge by correcting the integrated state of charge after said data substitution when the state of charge of the battery is decreasing;
   wherein said decreasing side corrected state of charge calculating device corrects such that a difference between said integrated state of charge and said corrected state of charge increases as the integrated value of the charge and discharge currents increases.

2. A state of charge measuring apparatus for a battery device comprising:
   a battery;
   a load driven by electrical power supplied from the battery device and a state of charge calculating device for detecting a charge current and discharge current of said battery device and for calculating an integrated state of charge of the battery based on integrated values of charge current and discharge current, comprising:
   a voltage detecting device for detecting a terminal voltage of said battery device;
   an upper limit substitution device for substituting said integrated state of charge value to an upper limit state of charge when a detected voltage obtained by said terminal voltage detecting device exceeds a predetermined voltage; and
   an increasing side corrected state of charge calculating device for calculating a corrected state of charge by correcting the integrated state of charge after said data substitution when the state of charge of the battery is increasing;
   wherein said increasing side corrected state of charge calculating device corrects such that a difference between said integrated state of charge and said corrected state of charge increases as the integrated value of the charge and discharge currents increases.

3. A state of charge measuring apparatus for a battery device according to claim 1, wherein, said battery state of charge measuring apparatus further comprises:
   an upper limit substitution value calculating device for calculating a substitution value from said integrated state of charge to said upper limit value by a difference between said integrated state of charge and said upper limit value; and
   said decreasing side corrected state of charge calculating device comprises a correction value incrementing device, provided to be used when the correction value falls below a predetermined correction value while defining a first unit correction value used as a correction value for one time data substitution, for incrementing the correction value by adding a first unit correction value each time when the data substitution is repeated.

4. A state of charge measuring apparatus for a battery device according to claim 3, further comprising:
   a lower limit substitution value calculating device for calculating a substitution value for substituting from said integrated state of charge to the lower limit based on a difference between said integrated state of charge and said lower limit value,
   wherein said increasing side correction state of charge incrementing device defines a first predetermined unit correction value as a value for correcting at one correction time, when the substitution value is greater than a predetermined value; and increases said correction value by adding said first unit correction value each time when the data substitution is performed.

5. A state of charge measuring apparatus for a battery device according to claim 3, wherein said correction value incrementing device adjusts said correction value as the same value as that of the substitution value when a difference between said substitution value and said added corrected value is less than said first unit correction value.

6. A state of charge measuring apparatus for a battery device according to claim 4, when a difference between said substitution value and said added corrected value is less than said first unit correction value, said correction value incrementing device corrects the state charge of the battery device using a correction value that is a sum of the second unit correction value, which is less than said first unit correction value, and the corrected value obtained until the previous correction time.

7. A state of charge measuring apparatus for a battery device according to claim 4, wherein said correction value incrementing device adjusts said correction value by addition of a second correction value which is smaller than the first unit correction value with the corrected value obtained until the previous correction time.

8. A state of charge measuring apparatus for a battery device according to claim 1, comprising a display device for displaying said corrected state of charge.

9. A state of charge measuring apparatus for a battery device according to claim 2, comprising a display device for displaying said corrected state of charge.

10. A state of charge measuring apparatus for a battery device according to claim 3, comprising a display device for displaying said corrected state of charge.

11. A state of charge measuring apparatus for a battery device according to claim 4, comprising a display device for displaying said corrected state of charge.

12. A state of charge measuring apparatus for a battery device according to claim 5, comprising a display device for displaying said corrected state of charge.

13. A state of charge measuring apparatus for a battery device according to claim 7, comprising a display device for displaying said corrected state of charge.

* * * * *